United States Patent
Takiguchi et al.

(10) Patent No.: US 7,088,747 B2
(45) Date of Patent: Aug. 8, 2006

(54) VARIABLE WAVELENGTH LIGHT SOURCE

(75) Inventors: Yoshihiro Takiguchi, Hamamatsu (JP);
Kensaku Itoh, Fuchu-machi (JP);
Junpei Yamanaka, Nagoya (JP)

(73) Assignee: Hamamatsu Photonics K.K., Shizuoka (JP)

( * ) Notice: Subject to any disclaimer, the term of this patent is extended or adjusted under 35 U.S.C. 154(b) by 0 days.

(21) Appl. No.: 10/381,317

(22) PCT Filed: Sep. 26, 2001

(86) PCT No.: PCT/JP01/08383

§ 371 (c)(1),
(2), (4) Date: Oct. 30, 2003

(87) PCT Pub. No.: WO02/27383

PCT Pub. Date: Apr. 4, 2002

(65) Prior Publication Data

US 2004/0057472 A1 Mar. 25, 2004

(30) Foreign Application Priority Data

Sep. 26, 2000 (JP) .................... 2000-292709

(51) Int. Cl.
*H01S 3/10* (2006.01)
*H01S 3/115* (2006.01)
*H01S 3/121* (2006.01)
*H01S 3/091* (2006.01)
*H01S 3/08* (2006.01)

(52) U.S. Cl. .................. 372/20; 372/9; 372/12; 372/14; 372/75; 372/92; 385/125

(58) Field of Classification Search .............. 372/9, 372/12, 14, 20, 43, 54, 69, 75, 92, 98, 99, 372/108; 385/8, 125
See application file for complete search history.

(56) References Cited

U.S. PATENT DOCUMENTS

| 5,999,308 | A | * | 12/1999 | Nelson et al. ............ 359/321 |
| 6,058,127 | A | | 5/2000 | Joannopoulos et al. ...... 372/92 |
| 6,064,506 | A | | 5/2000 | Koops .................. 359/237 |
| 6,542,682 | B1 | * | 4/2003 | Cotteverte et al. ......... 385/125 |
| 6,597,721 | B1 | * | 7/2003 | Hutchinson et al. ......... 372/98 |
| 2004/0008934 | A1 | | 1/2004 | Takiguchi et al. ........... 385/27 |
| 2004/0012840 | A1 | | 1/2004 | Takiguchi et al. .......... 359/321 |

FOREIGN PATENT DOCUMENTS

WO  WO 98/59219 A2  12/1998
WO  WO 98/59219      12/1998

OTHER PUBLICATIONS

Figotin, A., et al., "Tunable Photonic Crystals," Mat. Res. Soc. Symp. Proc., vol. 603, Nov. 30, 1999, pp. 195–200.

* cited by examiner

*Primary Examiner*—Minsun Oh Harvey
*Assistant Examiner*—Armando Rodriguez
(74) *Attorney, Agent, or Firm*—Drinker, Biddle & Reath LLP

(57) ABSTRACT

When a piezoelectric element 3 applies an external force to a plastic photonic crystal, the photonic crystal deforms, and accordingly, the photonic band gap easily changes. When the photonic band gap changes, transmission of light with a specific wavelength is limited. Therefore, light with a desired wavelength is outputted from the photonic crystal 2 upon sufficient tuning, and extracted to the outside through an output window 6. In the present invention, a plastic photonic crystal 2 which can achieve sufficient wavelength tuning although it is small is used, and elements are unitized, so that the entire wavelength tunable light source unit is downsized.

2 Claims, 3 Drawing Sheets

VARIABLE WAVELENGTH LIGHT SOURCE

TECHNICAL FIELD

This invention relates to a wavelength tunable light source unit.

BACKGROUND ART

A semiconductor single crystal is a material composed of a periodic and regular configuration of specific atoms. Its electron propagation property is determined by the interatomic spacing in the semiconductor crystal. Namely, a semiconductor has an energy band gap, and the energy band gap is determined depending on the wave nature of electrons and the periodic potential of atoms.

On the other hand, a photonic crystal is a material having optical potential differences, that is, a three-dimensional structure composed of substances with refractive index differences arranged in periods equivalent to light wavelengths. Such a photonic crystal was suggested by Yablonovich and others.

In a photonic crystal, the optical propagation property is limited by a binding condition concerning the wave nature of light. Namely, optical propagation in a photonic crystal is limited as well as electron propagation in a semiconductor. In a photonic crystal, an optical forbidden band, that is, a photonic band gap exists, and due to this existence, light in a specific waveband cannot propagate in the crystal.

Conventionally, various photonic crystals have been suggested. For example, a photonic crystal composed of submicron particles arranged in periods equivalent to light wavelengths exists. For microwaves, a photonic crystal composed of polymer particles arranged in a space is generally known.

In addition to these, there are various photonic crystals such as a photonic crystal that has periodic minute spaces formed in a metal by chemically dissolving polymer particles after solidifying the polymer particles in the metal, a photonic crystal with pores perforating at equal intervals into a metal, a photonic crystal which includes regions that are formed in a solid material by a laser so as to be different in refractive index from other regions, and a photonic crystal of photo-induced polymers formed in a groove shape by means of lithography. A photonic crystal formed by the abovementioned processing has a photonic band gap uniquely determined by the structure.

A wavelength tunable light source unit using such a photonic crystal can select and output a predetermined wavelength range of input light. In the description given below, light to be inputted into the photonic crystal is regarded as input light, and light to be outputted from the photonic crystal after being transmitted through the photonic crystal is regarded as output light.

DISCLOSURE OF INVENTION

However, in the wavelength tunable light source unit, the wavelength of output light thereof cannot be tuned since the photonic band gap of the photonic crystal cannot be sufficiently changed. he invention has been developed in view of these circumstances, and an object thereof is to provide a wavelength tunable light source unit which can sufficiently tune the wavelength of output light by employing a photonic crystal that is deformable by an external force.

A wavelength tunable light source unit relating to the invention comprises a plastic photonic crystal, external force applying means for applying an external force to the photonic crystal, a light source for inputting light with a plurality of wavelengths into the photonic crystal, and an output part for outputting light in a predetermined waveband selected by the photonic crystal, which are installed in a unit.

Light inputted into the photonic crystal from the light source changes its waveband in accordance with an external force applied by the external force applying means. Namely, the waveband of output light changes in accordance with the photonic band gap of the photonic crystal. In the invention, since the photonic crystal is plastic, the waveband of output light can be greatly changed, and since the elements are installed in a unit, the entire light source unit becomes compact.

In a case where the light source is a lamp, light outputted from the lamp is led into the plastic photonic crystal, a predetermined waveband is selected in accordance with the photonic band gap of the photonic crystal, and then light in the selected waveband is outputted to the outside via the output part.

In a case where the light source is a laser light source, light outputted from the laser light source is led into the plastic photonic crystal, a predetermined waveband is selected in accordance with the photonic band gap of the photonic crystal, and then light in the selected waveband is outputted to the outside via the output part.

Particularly, in the present invention, the abovementioned laser light source is a semiconductor laser having two opposed end faces for emitting light, light outputted from one of the end faces is inputted to a reflecting mirror through the photonic crystal, a laser resonator is constructed between the reflecting mirror and the other end face of the semiconductor laser, the other end face is optically coupled with the output part, and the waveband of light outputted from the output part changes in accordance with an external force that is applied by the external force applying means.

In this case, the photonic crystal is disposed inside the laser resonator between the reflecting mirror and the other end face, so that a resonant wavelength is selected by the photonic crystal, and light in the selected waveband is outputted to the outside via the output part.

It is also possible that the laser light source is a titanium sapphire laser including a resonator that contains a photonic crystal, and the titanium sapphire laser can generate pulsed light at intervals of femtoseconds, and the waveband thereof can be changed by the photonic crystal disposed inside the resonator.

BEST MODES FOR CARRYING OUT THE INVENTION

Hereinafter, a wavelength tunable light source unit of an embodiment is described. The same symbol is used for the same elements or elements having the same function, and overlapping description is omitted.

Figure 1:
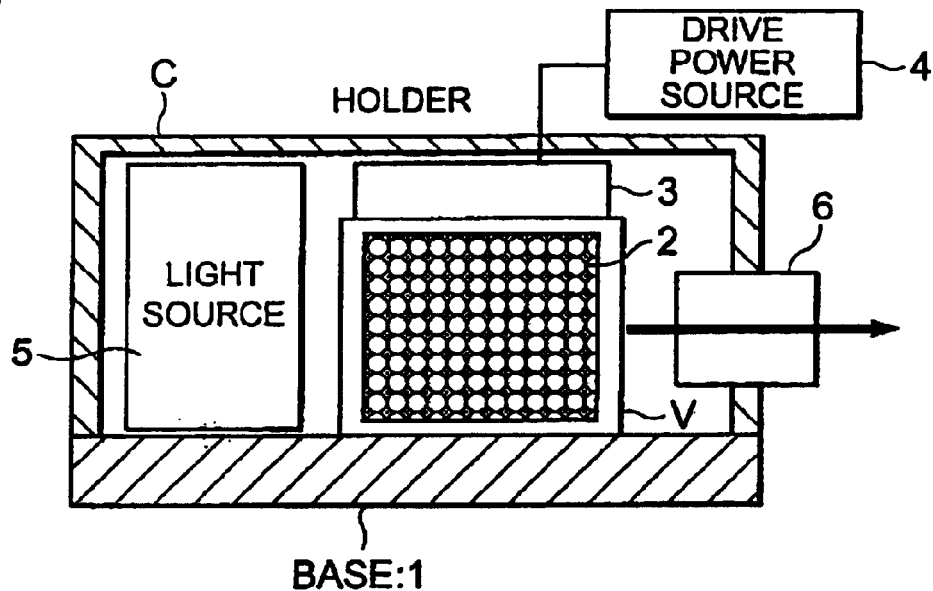
FIG. 1 is an explanatory view of a wavelength tunable light source unit.

FIG. 1 is an explanatory view of a wavelength tunable light source unit. This wavelength tunable light source has a light source 5 for emitting light with a plurality of wavelengths on a base, and light outputted from the light source 5 is inputted into a photonic crystal 2. The photonic crystal 2 is placed on the base 1. The photonic crystal 2 is energized by a piezoelectric element (external force applying means) 3 which applies a pressure on the crystal and reduces the pressure applied on the crystal. The photonic crystal 2 selects a desired waveband from the waveband of input light and outputs light in the selected waveband as output light through an output window (output part) 6. These elements 2, 3, and 5 are disposed in a cover member C that forms a housing in conjunction with the base 1 and the output window 6, and are unitized.

The photonic crystal 2 is a material which accurately deforms by being applied with an external force and changes the photonic band gap in accordance with the deformation. When its photonic crystal 2 is deformed by the piezoelectric element 3, the photonic band gap changes. The strength of the external force and the period of applying the force by the piezoelectric element 3 are controlled by a driving device 4.

Input light outputted from the light source 5 is inputted into the photonic crystal 2, and specific wavelength components in the input light cannot pass through the photonic crystal 2, and a predetermined waveband is selected in accordance with the photonic band gap (optical response characteristic) and outputted from the photonic crystal 2 as output light. The output light is inputted into the output window 6 that propagates light, and outputted toward the outside of this wavelength tunable light source unit through the output window 6. Namely, the optical coupling performance between the light source 5 and the output window 6 changes due to application of an external force.

Although this wavelength tunable light source unit changes the photonic band gap of the photonic crystal 2 by applying an external force to the photonic crystal 2, the photonic crystal 2 is plastic. Furthermore, the photonic crystal 2 may have elasticity.

Since the photonic crystal 2 is plastic, when an external force is applied to this crystal to deform it, the photonic band gap greatly changes and the wavelength of output light from the photonic crystal 2 sufficiently changes. In such a wavelength tunable light source unit, even when the volume of the photonic crystal 2 is reduced, wavelength selection can be effectively carried out, so that the entire light source unit can be downsized.

As described above, the wavelength tunable light source of the present embodiment comprises the plastic photonic crystal 2, the piezoelectric element 3 for applying an external force to the photonic crystal 2, the light source 5 for inputting light with a plurality of wavelengths into the photonic crystal 2, and the output window 6 for outputting light in a predetermined wavelength band that is selected by the photonic crystal 2, which are installed in a unit 2.

The light inputted into the photonic crystal 2 from the light source 5 changes its waveband in accordance with an external force applied by the piezoelectric element 3. Namely, the waveband of the output light changes in accordance with the photonic band gap of the photonic crystal 2. Since the photonic crystal 2 is plastic, they can greatly change the waveband of the output light, and since these elements are installed in a unit, the entire light source unit becomes compact.

In a case where the light source 5 is a lamp such as a mercury lamp, light outputted from the lamp is led into the plastic photonic crystal 2, and light in a predetermined waveband is selected in accordance with the photonic band gap of the photonic crystal 2 and outputted to the outside through the output window 6.

In this example, the photonic crystal 2 is a gel material, and is housed in a transparent container V.

In the case where the light source 5 is a laser light source, light outputted from the laser light source is led into the plastic photonic crystal 2, and light of a predetermined waveband is selected in accordance with the photonic band gap of the photonic crystal 2 and outputted to the outside through the output window 6.

Figure 2:
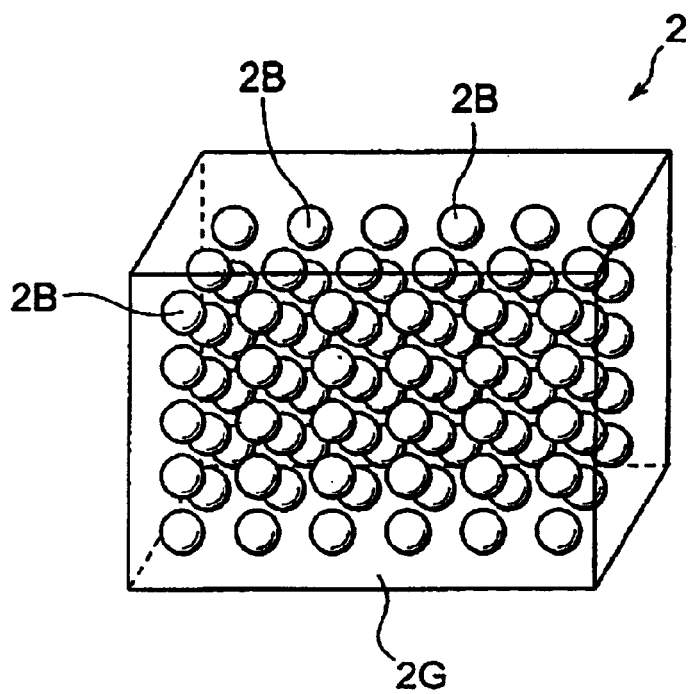
FIG. 2 is a perspective view of a photonic crystal 2.

FIG. 2 is a perspective view of the photonic crystal 2.

The photonic crystal 2 contains a plurality of microspheres (optical microcrystals) of silica or barium titanate in a gel material 2G. This photonic crystal 2 can be easily deformed. The microspheres 2B are regularly and evenly arranged in the material 2G in periods equivalent to light wavelengths. The interval of the microspheres 2G is between a quarter and a half of the light wavelength to be selected, and the microspheres 2B have permeability with respect to this wavelength. When light in a waveband $\Delta\lambda$ (including $\lambda_1$) enters the photonic crystal 2, only components in a specific waveband $\lambda_1$ in accordance with the photonic band gap are transmitted through the photonic crystal 2.

Since the gel is easily deformed by an external force, the photonic band gap of the photonic crystal 2 easily changes. In accordance with this change, the abovementioned waveband $\lambda_1$ passing through the photonic crystal 2 changes. The microspheres 2B and the material 2G are different in reflective index from each other, and both of these have permeability with respect to the selected light wavelength.

For example, a sol material mixed with an ultraviolet curing resin is used, and is gelled by being exposed to ultraviolet radiation. A typical ultraviolet curing resin contains a cross-linking agent and a photo polymerization initiator which are mixed with acrylamide, and various ultraviolet curing resins of this type have been generally known.

The number of periodic structures of the microspheres 2B is about 50, so that the photonic crystal 2 can sufficiently function even with a 100 μm squire size at the maximum. Therefore, use of this photonic crystal 2 can achieve downsizing of the unit. It is also possible that bubbles are used in place of the microspheres 2B.

Figure 3:
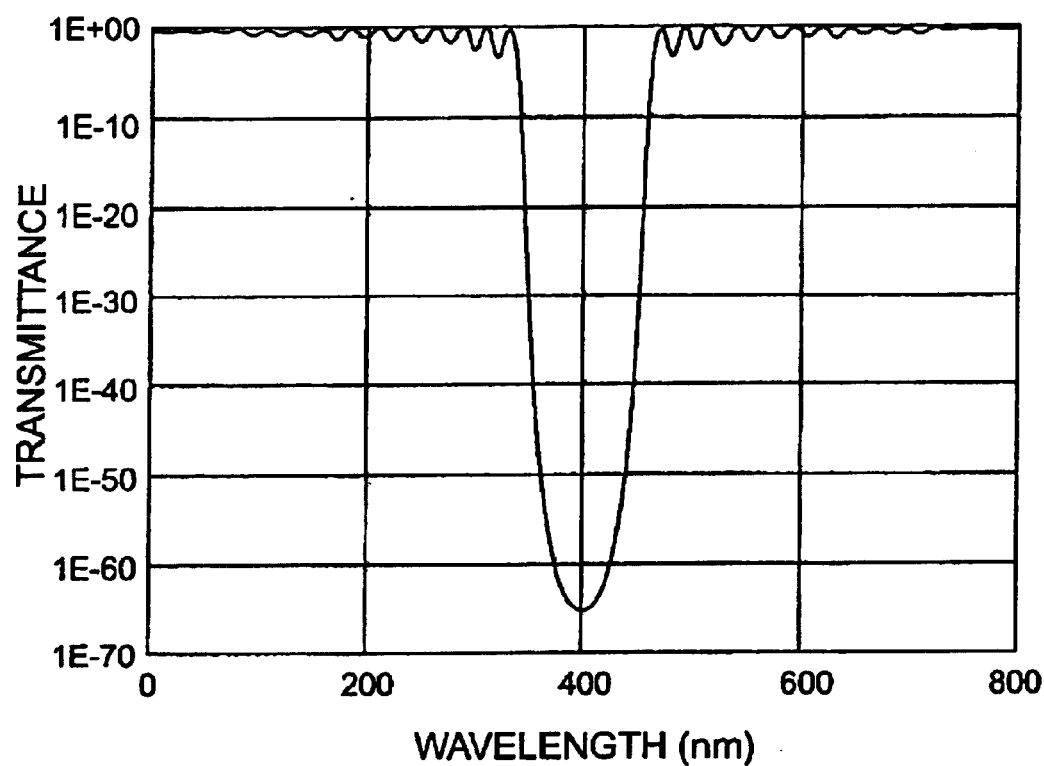
FIG. 3 is a graph showing wavelength (nm) dependence of the transmittance (optional constant) of output light through a dichroic mirror.

FIG. 3 is a graph showing wavelength (nm) dependence of the transmittance (optional constant) of output light through a multilayer photonic crystal, that is, a dichroic mirror. The input light is white light. The characteristic shown in this graph is not of the abovementioned photonic crystal 2, however, in a case where the microspheres 2B are arranged at completely equal intervals, the optical characteristic of the photonic crystal 2 becomes identical to that shown in this figure with respect to a specific direction. In this example, the transmittance of light around a 400 nm waveband is lower than the transmittances of other wavebands.

Figure 4:
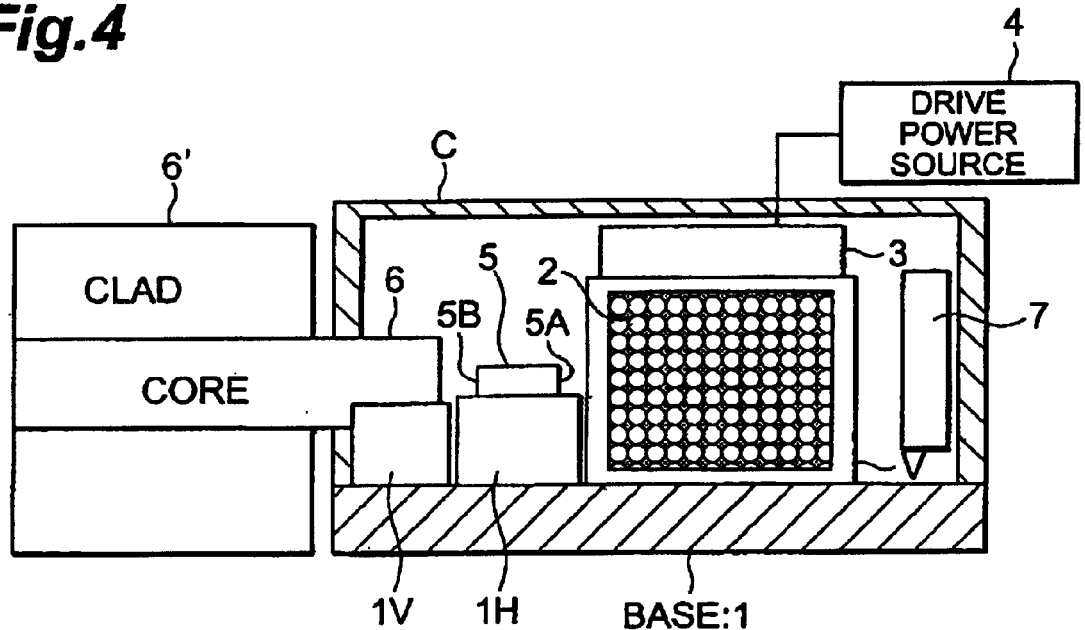
FIG. 4 is an explanatory view of a wavelength tunable light source unit relating to another embodiment.

FIG. 4 is an explanatory view of a wavelength tunable light source relating to another embodiment. This wavelength tunable light source uses a semiconductor laser having two opposed end faces 5A and 5B for emitting light as the abovementioned laser light source 5. Light outputted from one end face 5A is inputted to a reflecting mirror 7 through a photonic crystal 2, and a laser resonator is constructed between the reflecting mirror 7 and the other end face 5B. The photonic band gap in such a photonic crystal 2 is set upon consideration of a basic wave and a harmonic wave of the laser light source so that resonance is performed at these wavelengths.

The core of an optical fiber is inserted into an opening made in the cover member C, and the front end of the core 6 is placed on a V-grooved base 1V fixed on the base 1, and the semiconductor laser 5 is fixed on a heat sink 1H that is fixed on the base 1.

The other end face 5B of the semiconductor laser 5 is optically coupled with the core 6 that serves as an output part 6, and the waveband of light outputted from the core 6 changes in accordance with an external force applied by the piezoelectric element 3.

The core is surrounded by a clad 6', and these form an optical fiber.

In the present embodiment, the photonic crystal 2 is disposed in a laser resonator constructed between the reflecting mirror 7 and the other end face 5B, so that a resonant wavelength is selected by the photonic crystal 2, and light in the selected wave band is outputted to the outside through the output part 6.

Furthermore, a commercially available wavelength tunable light source which rotates a diffraction grating and makes it to serve as a wavelength selector to select and output a specific wavelength has been generally known. Although such a commercially available light source is large-scale, the wavelength tunable light source unit of the abovementioned embodiment can be made compact in comparison with the commercially available light source since the plastic photonic crystal 2, that is, a gelled photonic crystal is used.

For example, it is also possible that the photonic crystal 2 is produced by using the semiconductor micro-machining technology (micro electro-mechanical systems: MEMS technology). The abovementioned container V is formed by processing a semiconductor substrate (not shown), and a piezoelectric element 3 is formed on this semiconductor substrate. In this case, the photonic crystal 2 is disposed inside the container formed of the semiconductor substrate, more specifically, inside a concave portion, and the piezoelectric element 3 is formed on this semiconductor substrate, so that these elements can be formed by using the semiconductor micro-machining technology, and the entire unit can be downsized. As a matter of course, it is also possible that a drive circuit, a power source, and a photodiode with a wavelength filter, etc., can be formed inside the semiconductor substrate.

Figure 5:
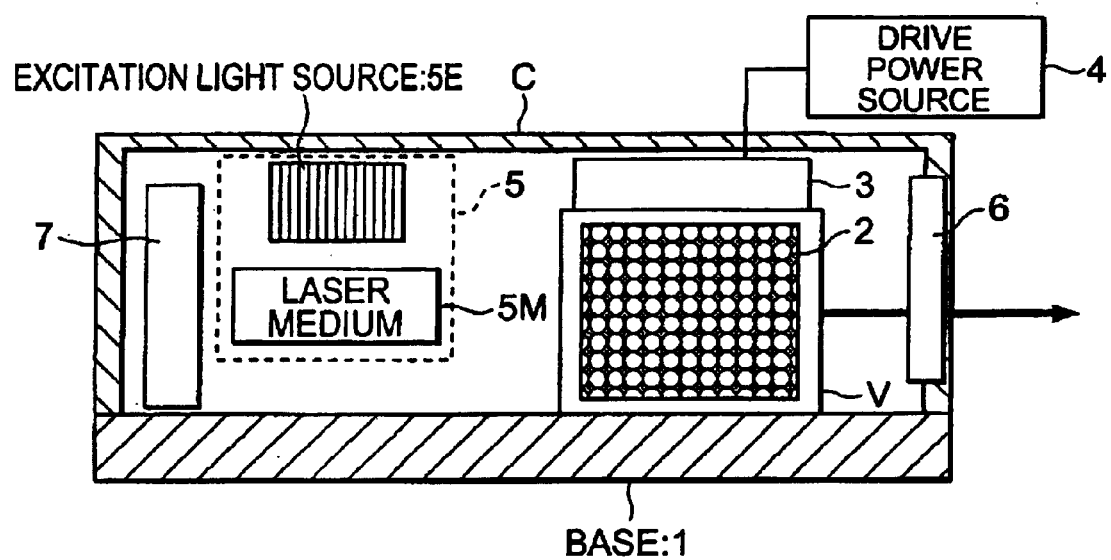
FIG. 5 is an explanatory view of a wavelength tunable light source unit relating to still another embodiment.

FIG. 5 is an explanatory view of a wavelength tunable light source relating to still another embodiment. This wavelength tunable light source is different from the light source shown in FIG. 4 in that an excitation light source 5E and a laser medium 5M are used for the laser light source 5, and a laser resonator including the laser medium 5M is constructed between an output mirror 6 that is provided in place of the optical fiber core 6 and a reflecting mirror 7.

Excitation light emitted from the excitation light source 5E is inputted into the laser medium 5M, and the laser medium 5M is excited to output a laser beam from its end face. The emitted laser beam is amplified and resonated while reciprocating between the two reflecting mirrors 6 and 7 that are disposed opposite to each other in the unit, and the amplified laser beam is outputted to the outside through the reflecting mirror (output mirror) 6 having the lower reflectance.

A laser beam wavelength which can reciprocate in this laser resonator is limited by the photonic crystal 2, and is changed by an external force applied by the piezoelectric element 3. In this example, the waveband of the output light also changes in accordance with the amount of driving of the piezoelectric element 3.

In this example, the laser medium 5M is Ti sapphire. The laser light source 5 using this is a titanium sapphire laser including a resonator that contains the photonic crystal 2. The titanium sapphire laser changes the time interval as well as the wavelength. The titanium sapphire laser can generate pulsed light at femtosecond time intervals, and the waveband thereof can be changed by the photonic crystal 2 disposed inside the resonator. Furthermore, it is also possible that a $Cr^{3+}$:$LiSrAlF_6$ crystal or a $Cr^{3+}$:$LiCaAlF_6$ crystal is used as the laser medium 5M.

A Fabry-Perot interferometer and a multilayer mirror (dichroic mirror) also use zero-dimensional or one-dimensional photonic crystals. The photonic crystal 2 can also be used for these purposes. Furthermore, it is expected that, regarding the soft photonic crystal 2 mentioned above, research will be further advanced in future on the size or arranging stability of the microspheres 2B or bubbles, mechanical accuracy to improve controllability, long-term stability of the gel, temperature stability, method of connection to the optical fiber or other optical parts, the gel sealing container, and the external force applying mechanism which can apply an equal external force each time.

INDUSTRIAL APPLICABILITY

The present invention can be used for a wavelength tunable light source unit.

What is claimed is:

1. A wavelength tunable light source unit, comprising:
   a plastic photonic crystal;
   external force applying means for applying an external force to said photonic crystal;
   a laser light source for inputting light with a plurality of wavelengths into said photonic crystal; and
   an output structure for outputting light in a predetermined waveband that is selected by said photonic crystal;
   wherein the laser light source is a semiconductor laser having two opposed end faces for emitting light, light outputted from one of the end faces is inputted to a reflecting mirror through said photonic crystal, a laser resonator is constructed between said reflecting minor and the other one of the end faces, and the other one of the end faces is optically coupled with said output structure, and the waveband of light to be outputted from said output structure changes in accordance with an external force applied by said external force applying means.

2. The wavelength tunable light source unit according to claim 1, wherein said output structure comprises an output window.

* * * * *